(12) United States Patent
Baeumel et al.

(10) Patent No.: US 10,027,094 B2
(45) Date of Patent: Jul. 17, 2018

(54) POWER MODULE, POWER CONVERTER AND DRIVE ARRANGEMENT WITH A POWER MODULE

(71) Applicant: Conti Temic microelectronic GmbH, Nuremberg (DE)

(72) Inventors: Hermann Baeumel, Neumarkt / Opf. (DE); Edmund Schirmer, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 68 days.

(21) Appl. No.: 14/787,043

(22) PCT Filed: Apr. 17, 2014

(86) PCT No.: PCT/EP2014/057875
§ 371 (c)(1),
(2) Date: Oct. 26, 2015

(87) PCT Pub. No.: WO2014/173801
PCT Pub. Date: Oct. 30, 2014

(65) Prior Publication Data
US 2016/0105004 A1 Apr. 14, 2016

(30) Foreign Application Priority Data
Apr. 25, 2013 (DE) .......... 10 2013 207 507

(51) Int. Cl.
*H02B 1/20* (2006.01)
*H05K 7/14* (2006.01)
(Continued)

(52) U.S. Cl.
CPC ......... *H02B 1/20* (2013.01); *H01L 23/49537* (2013.01); *H01L 23/49548* (2013.01);
(Continued)

(58) Field of Classification Search
None
See application file for complete search history.

(56) References Cited

U.S. PATENT DOCUMENTS

| | | | |
|---|---|---|---|
| 6,642,576 B1 | 11/2003 | Shirasawa et al. | 257/328 |
| 8,294,272 B2 | 10/2012 | Yamada et al. | 257/773 |
| (Continued) | | | |

FOREIGN PATENT DOCUMENTS

| | | | | |
|---|---|---|---|---|
| DE | 102011008952 A1 | 7/2012 | | H01L 23/16 |
| DE | 102012110494 A1 | 5/2013 | | H01L 21/58 |
| (Continued) | | | | |

OTHER PUBLICATIONS

German Office Action, Application No. 102013207507.3, 5 pages, dated Feb. 13, 2014.
(Continued)

*Primary Examiner* — Dimary Lopez Cruz
*Assistant Examiner* — Zhengfu Feng
(74) *Attorney, Agent, or Firm* — Slayden Grubert Beard PLLC

(57) ABSTRACT

A power module for a power converter includes a first busbar with a first surface and a second surface opposite the first surface, a first semiconductor component on the first surface of the first busbar, which semiconductor component has a first surface with a first electrical surface contact connection and is connected, via the first surface contact connection, to the first surface of the first busbar in an electrically conductive and mechanical fashion over an area, and a second semiconductor component on the second surface of the first busbar, which semiconductor component has a first surface with a first electrical surface contact connection and is connected, via the first surface contact connection of the second semiconductor component, to the (Continued)

second surface of the first busbar in an electrically conductive and mechanical fashion over an area.

12 Claims, 3 Drawing Sheets

(51) Int. Cl.
H01L 23/495 (2006.01)
H02M 1/08 (2006.01)
H01L 23/00 (2006.01)

(52) U.S. Cl.
CPC .. *H01L 23/49562* (2013.01); *H01L 23/49568* (2013.01); *H01L 23/49575* (2013.01); *H02M 1/08* (2013.01); *H05K 7/1432* (2013.01); *H01L 24/06* (2013.01); *H01L 24/29* (2013.01); *H01L 24/32* (2013.01); *H01L 24/33* (2013.01); *H01L 2224/04026* (2013.01); *H01L 2224/06181* (2013.01); *H01L 2224/291* (2013.01); *H01L 2224/32245* (2013.01); *H01L 2224/33181* (2013.01); *H01L 2924/1203* (2013.01); *H01L 2924/1306* (2013.01); *H01L 2924/13055* (2013.01); *H01L 2924/13091* (2013.01)

(56) References Cited

U.S. PATENT DOCUMENTS

| 8,390,041 | B2 | 3/2013 | Yoshimochi | 257/288 |
| 9,048,338 | B2 * | 6/2015 | Hosseini | H01L 24/83 |
| 2012/0181996 | A1 | 7/2012 | Gehrke | 323/271 |
| 2013/0062743 | A1 | 3/2013 | Kim et al. | 257/675 |
| 2013/0069108 | A1 | 3/2013 | Lee et al. | 257/133 |

FOREIGN PATENT DOCUMENTS

| JP | 2002208673 A | 7/2002 | H01L 25/065 |
| JP | 2003197859 A | 7/2003 | H01L 25/07 |
| JP | 2005072204 A | 3/2005 | H01L 25/065 |
| JP | 2005303018 A | 10/2005 | H01L 25/065 |
| JP | 2005340639 A | 12/2005 | H01L 25/07 |
| JP | 2006049542 A | 2/2006 | H01L 25/07 |
| JP | 2008042074 A * | 2/2008 | H01L 24/32 |
| JP | 2009043820 A | 2/2009 | H01L 23/48 |
| JP | 2010016947 A | 1/2010 | H01L 25/07 |
| JP | 2010034350 A | 2/2010 | H01L 21/60 |
| JP | 2010251711 A | 11/2010 | H01L 23/36 |
| JP | 2013062479 A * | 4/2013 | H01L 23/3735 |
| WO | 2014/173801 A1 | 10/2014 | H01L 23/495 |

OTHER PUBLICATIONS

International Search Report and Written Opinion, Application No. PCT/EP2014/057875, 19 pages, dated Aug. 25, 2014.

Chinese Office Action, Application No. 201480023544.8, 12 pages, dated May 26, 2017.

* cited by examiner

POWER MODULE, POWER CONVERTER AND DRIVE ARRANGEMENT WITH A POWER MODULE

CROSS-REFERENCE TO RELATED APPLICATIONS

This application is a U.S. National Stage Application of International Application No. PCT/EP2014/057875 filed Apr. 17, 2014, which designates the United States of America, and claims priority to DE Application No. 10 2013 207 507.3 filed Apr. 25, 2013, the contents of which are hereby incorporated by reference in their entirety.

TECHNICAL FIELD

The present invention relates to a power module for a power converter as well as a power converter having said power module. Further, the invention relates to a drive arrangement for driving a vehicle with said power module.

BACKGROUND

A power converter is used for the operation of an electrical machine of a hybrid or electric vehicle, said power converter supplying phase currents for the electrical machine for the operation thereof. The power converter comprises a plurality of electronic or electric elements, such as semiconductor components and electrical connections between the semiconductor components. These elements require a corresponding installation space in the power converter, which must be sufficiently large to accommodate these elements. A larger power converter in turn occupies a larger installation space in the vehicle, which is then no longer available for other vehicle parts.

SUMMARY

One embodiment provides a power module for a power converter comprising a first busbar with a first surface and a second surface opposite the first surface, a first semiconductor component on the first surface of the first busbar, said semiconductor component comprising a first surface with a first electrical surface contact terminal, and being connected in an electrically conductive, flat and mechanical manner via the first surface contact terminal to the first surface of the first busbar, and a second semiconductor component on the second surface of the first busbar, which comprises a first surface with a first electrical surface contact terminal, and which is connected in an electrically conductive, flat and mechanical manner via the first surface contact terminal of the second semiconductor component to the second surface of the first busbar.

In a further embodiment, the power module further comprises a second busbar having a first surface, wherein the first semiconductor component comprises a second surface opposite the first surface with a second electrical surface contact terminal, and is connected in an electrically conductive, flat and mechanical manner via the second surface contact terminal to the first surface of the second busbar.

In a further embodiment, at least one of the first busbars and/or at least one of the second busbars comprises a first region, via which the at least one busbar can be connected in an electrically conductive, flat and mechanical manner to an electrical unit.

In a further embodiment, the first busbar comprises a second region, via which the first busbar can be connected in a thermally conductive, electrically insulating, flat and mechanical manner to a cooling unit.

In a further embodiment, the power further comprises a third busbar having a first surface, wherein the first semiconductor component comprises on the second surface a third electrical surface contact terminal, and is connected in an electrically conductive, flat and mechanical manner via the third electrical surface contact terminal to the first surface of the third busbar.

In a further embodiment, the power module further comprises a fourth busbar having a first surface, wherein the second semiconductor component comprises a second surface opposite the first surface with a second electrical surface contact terminal, and is connected in an electrically conductive, flat and mechanical manner via the second electrical surface contact terminal to the first surface of the fourth busbar.

In a further embodiment, the second busbar and the fourth busbar are integrally formed.

In a further embodiment, the first semiconductor component is designed as a housingless semiconductor switch, and/or the second semiconductor component is designed as a housingless semiconductor diode.

Another embodiment provides a power converter for supplying at least one phase current for an electrical machine having a power module as described above.

Another embodiment provides a drive arrangement for driving a vehicle with an electrical machine, wherein the drive arrangement comprises a power converter for supplying at least one phase current for an electrical machine, wherein the power converter comprises a power module as described above.

BRIEF DESCRIPTION OF THE DRAWINGS

Example embodiments of the invention are explained in more detail below with reference to the drawings, in which.

DETAILED DESCRIPTION

Figure 1:
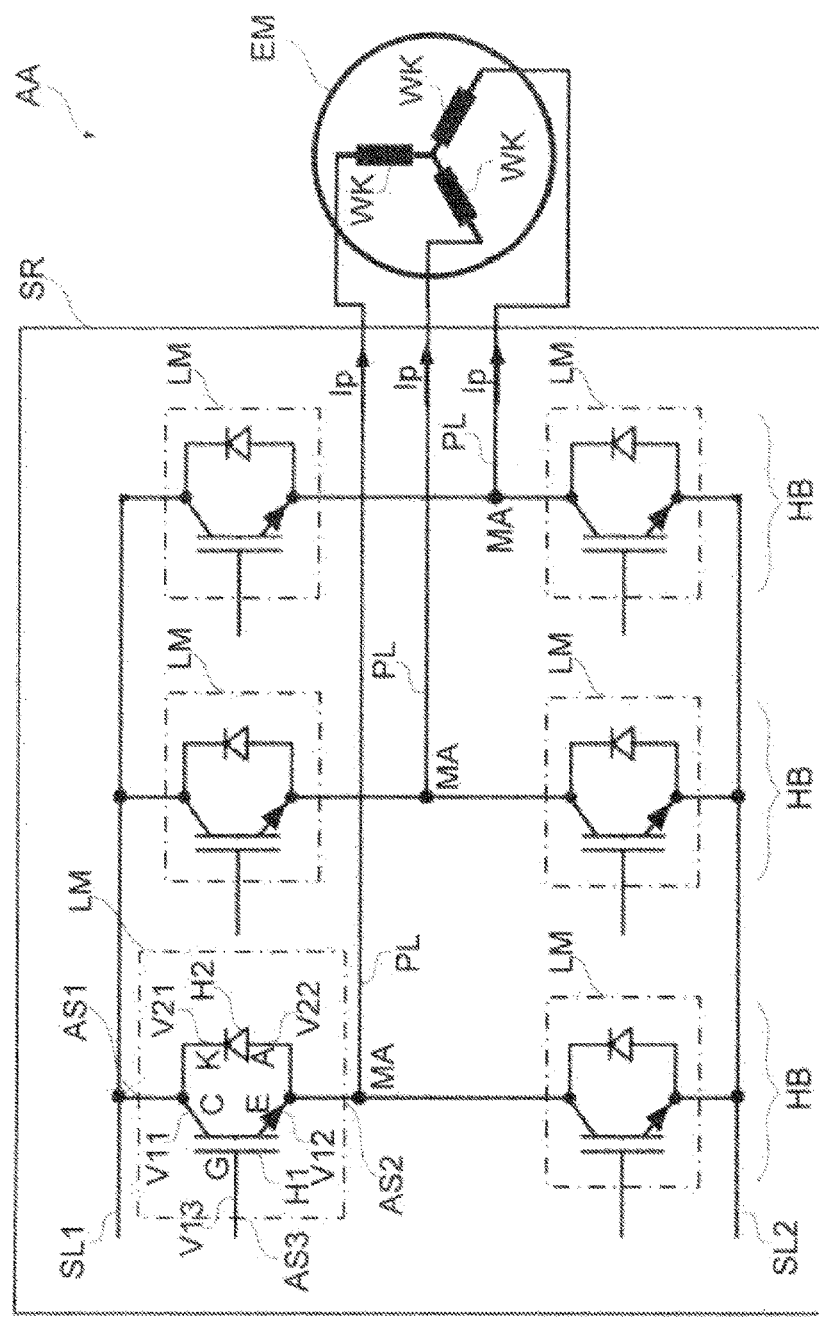
FIG. 1 shows in a schematic circuit diagram a part of a drive arrangement of a vehicle with a power converter having power modules according to one embodiment of the invention.

Embodiments the present invention reduce the installation space of a power converter.

Some embodiments of the invention provide a power module having a first busbar and a first semiconductor component and a second semiconductor component. Here, the first semiconductor component is flatly designed and comprises a first surface having a first electrical surface contact terminal for producing a flat electrical connection to a first voltage potential. Analogously, the second semiconductor component is flatly designed and in turn comprises a first surface having a first electrical surface contact terminal for producing a flat electrical connection to the first voltage potential. Here, the electrical surface contact terminals are formed both on the first and the second semiconductor component, respectively as a flatly extending electrical contact. The first busbar is formed from an electrically and preferably thermally conductive material and serves for conducting the first voltage potential to the first and the second semiconductor component. Here, the first busbar comprises a first surface and a second surface lying opposite the first surface, wherein the first and the second surfaces are respectively designed as an extending plane. The first semiconductor component is arranged on the first surface of the first busbar and is connected in a flatly extending, electrically conductive and mechanical manner to the first surface of the first busbar via the first electrical surface contact terminal.

Analogously, the second semiconductor component is arranged on the second surface of the first busbar and preferably opposite the first semiconductor component. The second semiconductor component is connected via the first electrical surface contact terminal to the first busbar in a flatly extending, electrically conductive and mechanical manner. Here, these electrically conductive flat connections between the busbar and the two semiconductor components may also be thermally conductive. By "flatly extending electrical connection" is meant here an electrical connection which is in particular free of bonding wire, and thus not formed by points, but rather via an extended flat contact surface.

Through the design of the semiconductor components and the electrical connections between the semiconductor components of a power converter in a power module, a possibility is provided to efficiently reduce the necessary installation space for the arrangement of these elements in the power converter. It was recognized here that the installation space of a conventional power converter is occupied inter alia by electrical connections between the semiconductor components, which are usually designed as bond connections to bonding wires wired between the semiconductor components. This bond connection typically requires a bonding frame as a mechanical support for the conducting structures of the bond connection, which occupies a corresponding installation space in the power converter. Because elements such as semiconductor components, which are formed without their own electrically insulative housing, are used in the power converter, it is additionally necessary that the bonding wires of the bond connections must have a certain distance from those elements with which the bonding wires may not come into electrical contact. This likewise claims a correspondingly larger installation space in the power converter.

According to the approach described herein, no bond connections are provided, but rather a flatly extending surface connection with thin flatly extending busbars is used. This connection is an electromechanical direct connection which requires no additional installation space.

To further reduce the installation space for a circuit carrier of the power converter, which is necessary for carrying and holding the semiconductor components and electrical connections, the semiconductor components are arranged directly on the busbar and supported by the busbar. Here, the semiconductor components are distributed on two opposite surfaces of the busbar and oppositely arranged, so that electrical connection paths between the semiconductor components are shortened. The installation space in the power module is thereby additionally reduced. In this way, a power module for a power converter is provided which occupies in total a smaller installation space than the semiconductor components and the electrical connections between the semiconductor components of a conventional power converter. As a result, a power converter can be provided which occupies a small installation space in the vehicle.

Through the omission of bond connections, which are susceptible to temperature fluctuations in the power converter or vibrations in the power converter and thus form a weak point in terms of the lifetime reliability of the power converter, and through the use of the busbar, more stable and reliable electrical connections between the semiconductor components are realized. In addition, the short and flat electrical connection paths between the semiconductor components comprise a very low parasitic inherent inductance and a very small inherent resistance, which has a positive effect on power loss in the power module and thus in the power converter. The electrical and thermal characteristics of the power converter are thereby improved.

According to one embodiment, the power module further comprises a second busbar for conducting a second voltage potential, which is formed from an electrically and preferably thermally conductive material and which comprises a first surface. The first semiconductor component further comprises a second surface opposite the first surface, having a second electrical surface contact terminal for producing a flat electrical connection to the second voltage potential. The first semiconductor component is connected in a flatly extending, electrically conductive and mechanical manner to the first surface of the second busbar via the second electrical surface contact terminal.

As a result of the fact that the first and the second busbars are arranged on two opposite surfaces of the first semiconductor component, a layered overlapping arrangement of the first and the second busbars with the first semiconductor component lying therebetween is realized.

Because in addition the two busbars respectively serve as an outflow path for a flow of current to the first semiconductor component and as a return path for a flow of current from the first semiconductor component, the power module comprises in total a low parasitic coupling inductance in the two busbars.

According to a further embodiment, at least one of the first and the second busbars comprises a first region, via which the at least one busbar can be connected in an electrically conductive, flat and mechanical manner to an electrical unit, such as an electrical line.

Via this first region of the busbar, a direct flat and thus low-inductance electrical connection is enabled from the power module to an external electrical unit.

According to a further embodiment, the first busbar comprises a second region, via which the first busbar can be connected in a thermally conductive and preferably also electrically insulating, flatly extending and mechanical manner to a cooling unit.

This embodiment makes it possible that the heat generated by power losses in the semiconductor components is discharged via the first busbar to the cooling unit and emitted from there into the environment. Flat embodiment of the busbars and flatly extending thermal connections between the busbar and the semiconductor components and between the busbar and the cooling unit effect an efficient cooling of the semiconductor components and thus the power module.

According to a further embodiment, the power module comprises a third busbar made from an electrically and preferably thermally conductive material having a first surface for conducting a third voltage potential.

Here, the first semiconductor component comprises on the second surface a third electrical surface contact terminal for producing a flatly extending electrical connection to the third voltage potential. The first semiconductor component is connected via this third electrical surface contact terminal to the first surface of the third busbar in a flatly extending, electrically and preferably thermally conductive and mechanical manner.

According to a further embodiment, the power module comprises a fourth busbar made from an electrically and preferably also thermally conductive material having a first surface for conducting the second voltage potential. The second semiconductor component comprises a second surface opposite the first surface, having a second electrical surface contact terminal for producing a flat electrical connection to the second voltage potential. The second semiconductor component is connected in a flatly extending, electrically and preferably also thermally conductive and mechanical manner to the first surface of the fourth busbar via the second electrical surface contact terminal.

The two last-mentioned embodiments may provide the advantage that, due to the overlapping and flat arrangement of the four busbars, the power module comprises in total a still lower parasitic connection inductance than if the busbars were arranged next to one another rather than atop one another.

According to a further embodiment, the second and the fourth busbar are integrally formed with one another. Here, this integrally formed busbar comprises a U- or Y-shaped cross-section when viewed in the direction along and in particular parallel to the surfaces of the busbar. In the regions which form power connections to external circuit units, busbars may be formed by stamping such that all of these regions are on one level, which is advantageous for possible further manufacturing processes. According to a further embodiment, the first semiconductor component is formed as a housingless semiconductor switch, such as a MOSFET switch (metal-oxide-semiconductor field-effect transistor) or an IGBT switch (insulated gate bipolar transistor). The second semiconductor component may be formed as a housingless semiconductor diode. Here, a so-called "naked" semiconductor component without an embedding housing, which is formed as a bar die, is further designated as a "housingless" semiconductor component.

According to a further embodiment, the electrically conductive, flatly extending and mechanical connections between the busbars and the semiconductor components are formed as flat solder joint connections, flat weld connections, flat adhesive connections or flat sintered connections.

Other embodiments provide a power converter for supplying at least one phase current for an electrical machine, which power converter comprises an above-described power module. Here, the second and the fourth busbar of the power module are designed for conducting the phase current to the electrical machine and are electrically conductively connected to a winding of the electrical machine.

Other embodiments provide a drive arrangement for driving a vehicle, in e.g., a hybrid or electric vehicle, with an electrical machine, wherein the drive arrangement comprises a power converter for supplying at least one phase current for an electrical machine, wherein the power converter comprises an above-described power module. Here, the second and the fourth busbar of the power module are designed to conduct the phase current to the electrical machine and are electrically conductively connected to a winding of the electrical machine.

Advantageous embodiments of the power module shown above are, in so far as can be incidentally transferred to the aforementioned power converter or to the aforementioned drive arrangement, also to be regarded as advantageous embodiments of the power converter or of the drive arrangement.

Reference is first made to FIG. 1, in which is shown a part of a drive arrangement AA of a vehicle, not shown, in a simplified schematic circuit diagram. The drive arrangement AA comprises an electrical machine EM for propulsion of the vehicle and a power converter SR for providing electrical energy in the form of phase currents Ip for the electrical machine EM.

The electrical machine EM is formed in this embodiment as a synchronous machine and comprises three windings WK. The three windings WK of the electrical machine EM are respectively electrically connected via a phase current line PL to the power converter SR and receive the phase currents Ip from the power converter SR via these three phase current lines PL.

The power converter SR is formed in this embodiment as a B6 bridge circuit and comprises three substantially identical half-bridges HB which are mutually arranged in a parallel circuit between a positive power supply line SL1 and a negative power supply line SL2.

Each of the three half-bridges HB respectively comprises two power modules LM, which are respectively distributed on a positive voltage side current path ("high-side") and thus between the positive power supply line SL1 and one of the phase current lines PL and on a negative voltage side current path ("low-side") and thus between one of the phase current lines PL and the negative power supply line SL2. The two power modules LM of a respective half-bridge HB are electrically connected to one another via a central connection MA and to one of the three phase current lines PL.

The power converter SR may comprise further circuit components, such as intermediate circuit capacitors, which are required for a general functioning of the power converter in a way known to a person of skill in the art but which are not necessarily relevant for a description of the invention and thus not described in more detail herein.

The power modules LM respectively comprise a first current terminal AS1 and a second current terminal AS2 for electrical connection to the positive, the negative power supply lines SL1, SL2 and the phase current lines PL.

The power modules LM arranged in the positive current path are electrically connected to the positive power supply line SL1 via the first current terminal AS1. These power modules LM are respectively electrically connected to one of the phase current lines PL via the second current terminal AS2.

The power modules LM arranged in the negative current path are electrically connected via the first current terminal AS1 to the respective second current terminal AS2 of the power modules LM of the respective half-bridge HB arranged in the positive current path and the respective phase current line PL. The respective second power modules LM are electrically connected to the negative power supply line SL2 via the second current terminal AS2.

The power modules LM of the three half-bridges HB are formed substantially identical to one another. For better understandability, only one of the power modules LM is thus described in more detail by way of example below.

The power module LM respectively comprises a normally conducting n-channel IGBT switch as a first semiconductor component H1 and a freewheeling diode as a second semiconductor component H2 in a parallel circuit.

The IGBT switch H1 comprises a collector terminal C, an emitter terminal E and a gate terminal G. Here, the collector terminal C is electrically connected to the first current terminal AS1 via a first electrical connection V11. The emitter terminal E is electrically connected via a second electrical connection V12 to the second current terminal AS2. The gate terminal G is electrically connected via a third electrical connection V13 to a signal terminal AS3, wherein a respective control signal is supplied to the gate terminal G for controlling the IGBT switch H1 via this signal terminal AS3.

It is apparent from FIG. 1 that the power converter SR converts a direct current provided from an electrical energy source not shown in the figure via the power supply lines SL1, SL2 into three phase currents IP in a manner familiar to a person of skill in the art through alternatingly switching on and off the six IGBT switches H1 of the three semiconductor bridges HB by means of the control signals, said power converter SR supplying these phase currents IP via the three phase current lines PL into the windings WK of the electrical machine EM for the operation thereof.

The freewheeling diode H2 comprises a cathode terminal K and an anode terminal A. Here, the cathode terminal K is electrically connected to the first current terminal AS1 via a first electrical connection V21. The anode terminal A is electrically connected via a second electrical connection V22 to the second current terminal AS2.

The freewheeling diode H2 serves to discharge parasitic induction currents, which arise during operation of the electrical machine EM in the windings WK, from the electrical machine EM to the power supply lines SL1, SL2.

A mechanical configuration of the power modules LM, in particular the circuitry arrangement of the IGBT switch H1 and the freewheeling diode H2 of the respective power modules LM and electrical connections between the IGBT switch H1 and the freewheeling diode H2 and to the respective first and second current terminal AS1, AS2 and the control signal terminal AS3, is described hereinafter in more detail with reference to FIGS. 2A, 2B, 2C, 2D and 3.

Reference is first made to FIGS. 2A, 2B, 2C, 2D, which respectively schematically represent in respective top view an upper side, i.e. a first surface O11, and an underside, specifically a second surface O12, of the IGBT switch H1 and an upper side, i.e. a first surface O21, and a lower side, specifically a second surface O22, of the freewheeling diode H2.

Here, the IGBT switch H1 and the freewheeling diode H2 are designed inter alia to reduce the necessary installation space of the power converter SR as housingless "naked" semiconductor components.

Figure 2A:
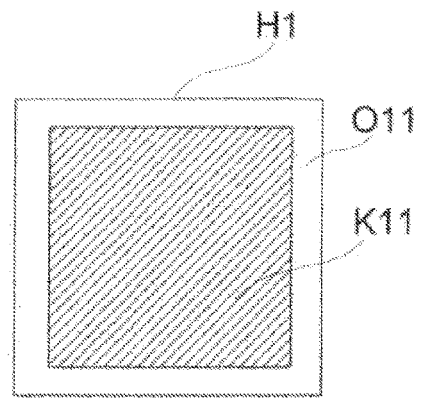
FIGS. 2A, 2B show in a schematic representation two surfaces of a first semiconductor component of a power module of the embodiment shown in FIG. 1.
Figure 2B:
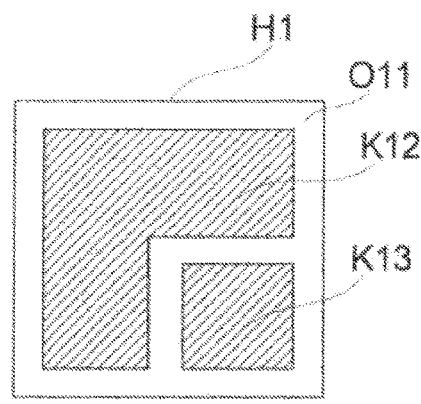

The IGBT switch H1 comprises—as can be seen in FIG. 2A—a first electrical surface contact terminal K11 on the first surface O11, said electrical surface contact terminal K11 forming the collector terminal C of the IGBT switch H1 represented in FIG. 1. On the second surface O12 opposite the first surface O11, the IGBT switch H1 comprises—as can be seen in FIG. 2B—a second electrical surface contact terminal K12 as the emitter terminal E represented in FIG. 1 and a third electrical surface contact terminal K13 as the gate terminal G represented in FIG. 1.

Figure 2C:
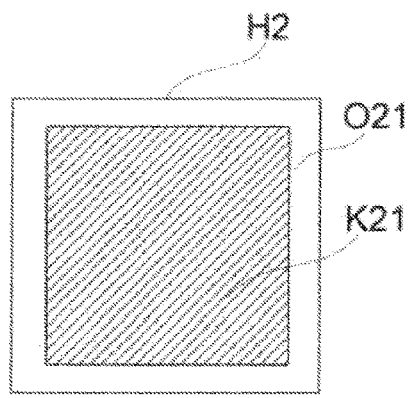
FIGS. 2C, 2D show in a schematic representation two surfaces of a second semiconductor component of the power module of the embodiment shown in FIG. 1.

The freewheeling diode H2 comprises—as can be seen in FIG. 2C—a first electrical surface contact terminal K21 on the first surface O21, said electrical surface contact terminal K211 forming the cathode terminal K of the freewheeling diode H2 represented in FIG. 1. On the second surface O22 opposite the first surface O21, the freewheeling diode H2 comprises—as can be seen in FIG. 2D—a second electrical surface contact terminal K22 as the anode terminal A represented in FIG. 1.

The surface contact terminals K11, K12, K13 and K21, K22 of the IGBT switch H1 and the freewheeling diode H2 extend flatly such that they cover almost the entire surfaces O11, O12 and O21, O22 of the IGBT switch H1 and the freewheeling diode H2.

Figure 3:
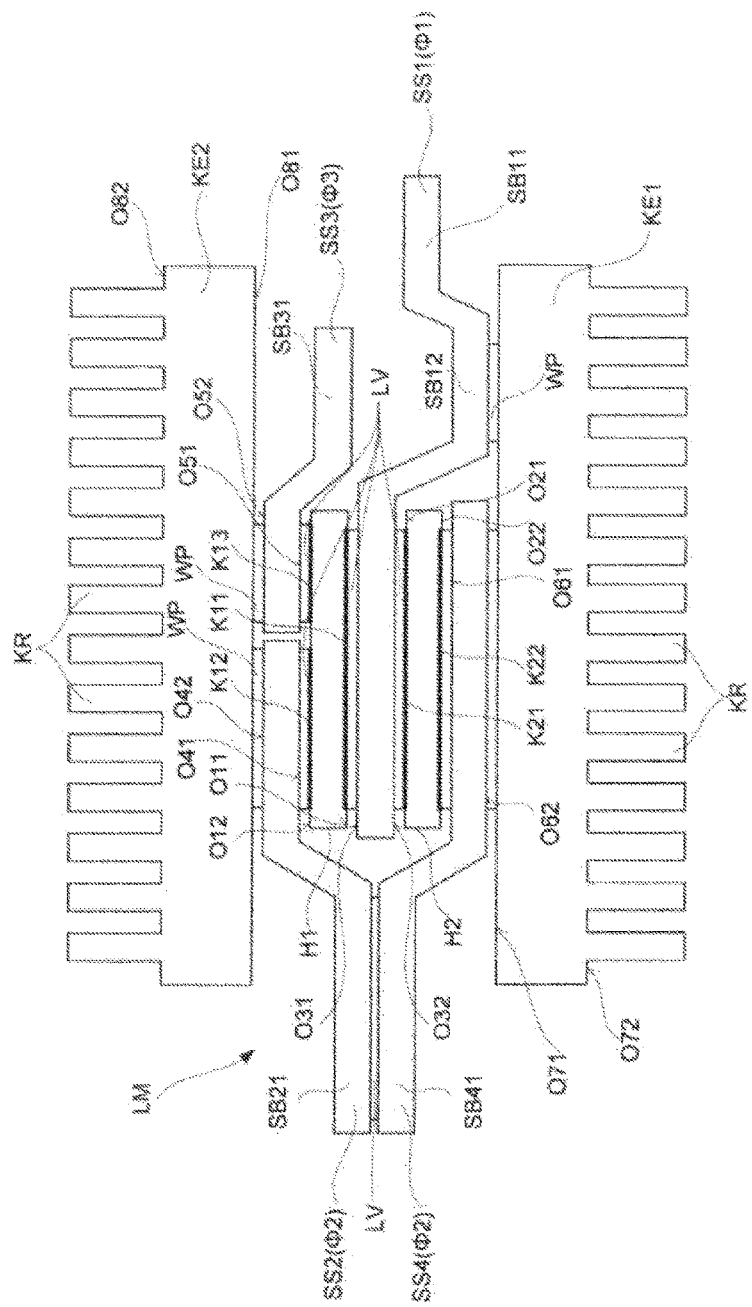
FIG. 3 shows in a schematic representation the power module of the embodiment shown in FIG. 1 in a mechanical assembly.

Reference is made hereinafter to FIG. 3, which shows a mechanical configuration of the power module LM including a first cooling unit KE1 and a second cooling unit KE2 in a schematic cross-sectional view perpendicular to the surface O11 of the IGBT switch H1 of the power module LM.

Figure 2D:
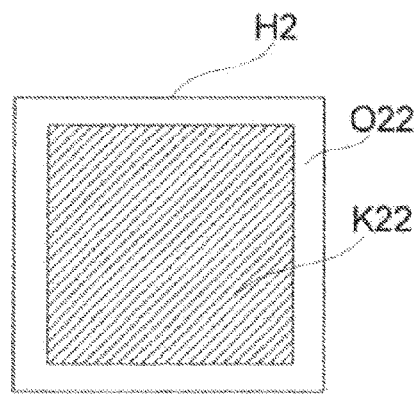

According to FIG. 3, the power module LM is arranged between the first and the second cooling units KE1, KE2 and comprises a first, a second, a third and a fourth busbar SS1, SS2, SS3 and SS4 as well as an IGBT switch H1 shown in FIGS. 2A and 2B and a freewheeling diode H2 shown in FIGS. 2C and 2D, which are arranged in overlapping layers.

Here, the first electrical connection V11 from the IGBT switch H1 to the first current terminal AS1 and the first electrical connection V21 from the freewheeling diode H2 to the first current terminal AS1 of the power module LM are realized by means of the first busbar SS1. The first busbar SS1 comprises here a first surface O31 and a second surface O32 opposite the first surface O31. On the first surface O31 of the first busbar SS1, the IGBT switch H1 is arranged with the first surface O11 thereof facing the first busbar SS1. Here, the first surface contact terminal K21, i.e. the collector terminal C of the IGBT switch H1, is electrically and thermally conductively and mechanically connected to the first busbar SS1 via a solder joint connection LV. On the second surface O32 of the first busbar SS1, the freewheeling diode H2 faces the first busbar SS1 with its first surface O21, and is arranged opposite the IGBT switch H1. Here, the first surface contact terminal K21, i.e. the cathode terminal K of the freewheeling diode H2, is likewise electrically and thermally conductively and mechanically connected to the first busbar SS1 via a solder joint connection LV.

An exposed portion of the first busbar SS1 is sunken in the direction toward the first cooling unit KE1 and comprises when regarded in the viewing direction of the viewer of this figure a U-shaped cross-section and comprises an exposed end region SB11 and a center region SB12 located comparatively closer to the first cooling unit KE1. Above the center region SB12, the first busbar SS1 is connected in a thermally conductive and electrically insulating and mechanical manner to a first surface O71 of the first cooling unit KE1 by means of a dielectric thermally conductive paste WP. The end region SB11 of the first busbar forms the first current terminal AS1 of the power module LM, via which the first busbar SS1 is electrically connected to the positive power supply line SL1 and one of the phase current lines PL and via which a first voltage potential $\Phi 1$ applied to the positive power supply line SL1 is applied to the respective first surface contact terminal K11, K21 of the IGBT switch H1 and the freewheeling diode H2.

The second busbar SS2 is arranged on the second surface O12 of the IGBT switch H1 and comprises a first surface O41 and a second surface O42 opposite the first surface O41. Via the first surface O41, the second busbar SS2 is electrically and thermally conductively and mechanically connected by means of a solder joint connection LV to the second surface contact terminal K12 and thus to the emitter terminal E of the IGBT switch H1. Via the second contact surface O42, the second busbar SS2 is connected in a thermally conductive but electrically insulating and mechanical manner to the second cooling unit KE2 by means of a further dielectric thermally conductive paste WP.

The third busbar SS3 is likewise arranged on the second surface O12 of the IGBT switch H1 and comprises a first surface O51 and a second surface O52 opposite the first surface O51. Here, the third busbar SS3 is electrically and thermally conductively and mechanically connected via the first surface O51 to the third surface contact terminal K13 and the gate terminal G of the IGBT switch H1 by means of a solder joint connection LV. Via the second surface O52, the third busbar SS3 is connected in a thermally conductive but electrically insulating and mechanical manner to the second cooling unit KE2 by means of a dielectric thermally conductive paste.

An exposed region of the third busbar SS3 which is not covered by the IGBT switch H1 is bent away from the second cooling unit KE2 and comprises an exposed end section, which forms the signal terminal AS3 of the power module LM, to which the control signal for driving the IGBT switch H1 is applied.

The fourth busbar SS4 is arranged on the second surface O22 of the freewheeling diode H2 and comprises a first surface O61 and a second surface O62 opposite the first surface O61. Here, the fourth busbar SS4 is electrically and thermally conductively and mechanically connected via the first surface O61 to the second surface contact terminal K22 and the anode terminal A of the freewheeling diode H2 by means of a solder joint connection LV.

Exposed regions of the second and the fourth busbars SS2, SS4 which are not covered by the IGBT switch H1 or the freewheeling diode H2 are bent toward one another and respectively comprise an end section SB21, SB41, which are electrically connected to one another via a solder joint connection LV and thus form a common end region. This common end region forms the second current terminal AS2 of the power module LM, via which the second and the fourth busbars SS2, SS4 are electrically connected to one of the phase current lines PL and the negative power supply line SL2. Alternatively, the second and the fourth busbars SS2, SS4 may be integrally formed.

The first cooling unit KE1 is arranged on the fourth busbar SS4 and is connected in a thermally conductive but electrically insulating and mechanical manner to the second surface O62 of the fourth busbar SS4 via a first surface O71 and by means of, for example, a further thermally conductive paste WP. The first cooling unit KE1 is provided on a second surface O72 opposite the first surface O71 with surface-enlarging cooling ribs KR which can discharge the heat absorbed by the power module LM more efficiently into the environment.

The second cooling unit KE2 is arranged on the second and third busbars SS2, SS3 and is connected in a thermally conductive but electrically insulating and mechanical manner to the second surface O42 of the second busbar SS2 and the second surface O52 of the third busbar SS3 via a first surface O81 and by means of, for example, a further thermally conductive paste WP. The second cooling unit KE2 comprises on a second surface O82 opposite the first surface O81 surface-enlarging cooling ribs KR which can discharge the heat absorbed by the power module LM more efficiently into the environment.

What is claimed is:

1. A power converter configured to supply at least one phase current for an electrical machine, the power converter comprising:
    a power module comprising:
    a first busbar having a first surface and a second surface opposite the first surface;
    a free end of the first busbar electrically connected to a positive power supply line as a first current terminal;
    a second busbar, a third busbar, and a fourth busbar, each having a respective first surface;
    wherein the second busbar and the fourth busbar are electrically connected to each other at respective free ends to form a second current terminal for the power module;
    a first semiconductor component mounted on the first surface of the first busbar, wherein said first semiconductor component comprises a first surface with a first electrical surface contact terminal, and wherein said first semiconductor component is connected in an electrically conductive, flat and mechanical manner via the first surface contact terminal to the first surface of the first busbar; and
    a second semiconductor component mounted on the second surface of the first busbar, wherein said second semiconductor component comprises a first surface with a first electrical surface contact terminal, and wherein said second semiconductor component is connected in an electrically conductive, flat and mechanical manner via the first surface contact terminal of the second semiconductor component to the second surface of the first busbar;
    wherein the first semiconductor component comprises a second surface opposite the first surface with a second electrical surface contact terminal and a third electrical surface contact terminal on the second surface;
    the first semiconductor component is connected in an electrically conductive, flat and mechanical manner via the second surface contact terminal to the first surface of the second busbar and the first semiconductor component is connected to the first surface of the third busbar in an electrically conductive, flat and mechanical manner via the third electrical surface contact terminal;
    a free end of the third busbar forms a signal terminal of the power module; and
    the second semiconductor component comprises a second surface opposite the first surface with a second electrical surface contact terminal and the second semiconductor component is connected to the first surface of the fourth busbar in an electrically conductive, flat and mechanical manner via the second electrical surface contact terminal.

2. A drive arrangement for driving a vehicle with an electrical machine, the drive arrangement comprising:
    a power converter for supplying at least one phase current for an electrical machine, the power converter comprising:
    a power module comprising:
    a first busbar having a first surface and a second surface opposite the first surface;
    a free end of the first busbar electrically connected to a positive power supply line as a first current terminal;
    a second busbar, a third busbar, and a fourth busbar, each having a respective first surface;
    wherein the second busbar and the fourth busbar are electrically connected to each other at respective free ends to form a second current terminal for the power module;
    a first semiconductor component mounted on the first surface of the first busbar, wherein said first semiconductor component comprises a first surface with a first electrical surface contact terminal, and wherein said first semiconductor component is connected in an electrically conductive, flat and mechanical manner via the first surface contact terminal to the first surface of the first busbar; and a second semiconductor component mounted on the second surface of the first busbar, wherein said second semiconductor component comprises a first surface with a first electrical surface contact terminal, and wherein said second semiconductor component is connected in an electrically conductive, flat and mechanical manner via the first surface contact terminal of the second semiconductor component to the second surface of the first busbar;

wherein the first semiconductor component comprises a second surface opposite the first surface with a second electrical surface contact terminal and a third electrical surface contact terminal on the second surface;

the first semiconductor component is connected in an electrically conductive, flat and mechanical manner via the second surface contact terminal to the first surface of the second busbar and the first semiconductor component is connected to the first surface of the third busbar in an electrically conductive, flat and mechanical manner via the third electrical surface contact terminal;

a free end of the third busbar forms a signal terminal of the power module; and the second semiconductor component comprises a second surface opposite the first surface with a second electrical surface contact terminal and the second semiconductor component is connected to the first surface of the fourth busbar in an electrically conductive, flat and mechanical manner via the second electrical surface contact terminal.

3. The drive arrangement of claim 2, wherein the first busbar comprises a first region configured for connection of the first busbar to an electrical unit in an electrically conductive, flat and mechanical manner.

4. The drive arrangement of claim 3, wherein the first busbar comprises a second region configured for connection of the first busbar to a cooling unit in a thermally conductive, electrically insulating, flat and mechanical manner.

5. The drive arrangement of claim 2, wherein the second busbar and the fourth busbar are formed integrally with each other.

6. The drive arrangement of claim 2, wherein:
the first semiconductor component comprises a housingless semiconductor switch, and/or
the second semiconductor component comprises a housingless semiconductor diode.

7. A power module for a power converter comprising:
a first busbar having a first surface and a second surface opposite the first surface;
a free end of the first busbar is electrically connected to a positive power supply line as a first current terminal;
a second busbar, a third busbar, and a fourth busbar, each having a respective first surface;
wherein the second busbar and the fourth busbar are electrically connected to each other at respective free ends to form a second current terminal for the power module;

a first semiconductor component mounted on the first surface of the first busbar, wherein said first semiconductor component comprises a first surface with a first electrical surface contact terminal, and wherein said first semiconductor component is connected in an electrically conductive, flat and mechanical manner via the first surface contact terminal to the first surface of the first busbar; and a second semiconductor component mounted on the second surface of the first busbar, wherein said second semiconductor component comprises a first surface with a first electrical surface contact terminal, and wherein said second semiconductor component is connected in an electrically conductive, flat and mechanical manner via the first surface contact terminal of the second semiconductor component to the second surface of the first busbar;

wherein the first semiconductor component comprises a second surface opposite the first surface with a second electrical surface contact terminal and a third electrical surface contact terminal on the second surface;

the first semiconductor component is connected in an electrically conductive, flat and mechanical manner via the second surface contact terminal to the first surface of the second busbar and the first semiconductor component is connected to the first surface of the third busbar in an electrically conductive, flat and mechanical manner via the third electrical surface contact terminal;

a free end of the third busbar forms a signal terminal of the power module; and the second semiconductor component comprises a second surface opposite the first surface with a second electrical surface contact terminal and the second semiconductor component is connected to the first surface of the fourth busbar in an electrically conductive, flat and mechanical manner via the second electrical surface contact terminal.

8. The power module of claim 7, wherein the first busbar comprises a first region configured for connection of the first busbar to an electrical unit in an electrically conductive, flat and mechanical manner.

9. The power module of claim 8, wherein at the first busbar comprises a second region configured for connection of the first busbar to a cooling unit in a thermally conductive, electrically insulating, flat and mechanical manner.

10. The power module of claim 7, wherein the second busbar and the fourth busbar are formed integrally with each other.

11. The power module of claim 7, wherein:
the first semiconductor component comprises a housingless semiconductor switch, and/or
the second semiconductor component comprises a housingless semiconductor diode.

12. The power module of claim 7, wherein both the first busbar and the second busbar each comprise a respective first region configured for connection of the respective busbar to an electrical unit in an electrically conductive, flat and mechanical manner.

* * * * *